United States Patent [19]

Breslow

[11] Patent Number: 4,465,928

[45] Date of Patent: Aug. 14, 1984

[54] OPTICALLY MULTIPLEXED ENCODER SYSTEM

[75] Inventor: Donald H. Breslow, Framingham, Mass.

[73] Assignee: Itek Corporation, Lexington, Mass.

[21] Appl. No.: 293,254

[22] Filed: Aug. 17, 1981

[51] Int. Cl.³ .............................................. G01D 5/34
[52] U.S. Cl. ......................... 250/231 SE; 340/347 P
[58] Field of Search ................... 250/231 SE, 237 G; 340/347 P; 356/395

[56] References Cited

U.S. PATENT DOCUMENTS 3,549,897 12/1970 Blake ........................... 250/231 SE
4,342,025 7/1982 Spalti et al. ............... 250/231 SE X

OTHER PUBLICATIONS

Spaulding, "How to Use Shaft Encoders", Datex Corporation 1965, pp. 23-24.

Primary Examiner—David C. Nelms
Assistant Examiner—Edward P. Westin
Attorney, Agent, or Firm—Homer O. Blair; Robert L. Nathans; Gerald H. Glanzman

[57] ABSTRACT

In an optically multiplexed angular encoder system, encoder illuminators are sequentially enabled and detected signals are sequentially stored. Such sampling and storage of the code track signals is repeated in successive sampling windows under the control of a free-running clock such that the information required to provide a multibit angular output is available for a near instantaneous output on command.

2 Claims, 6 Drawing Figures

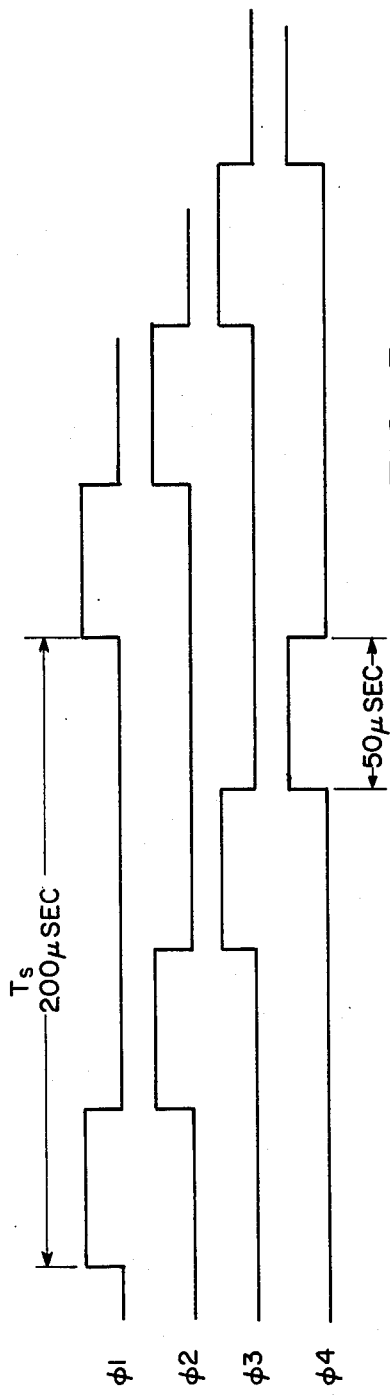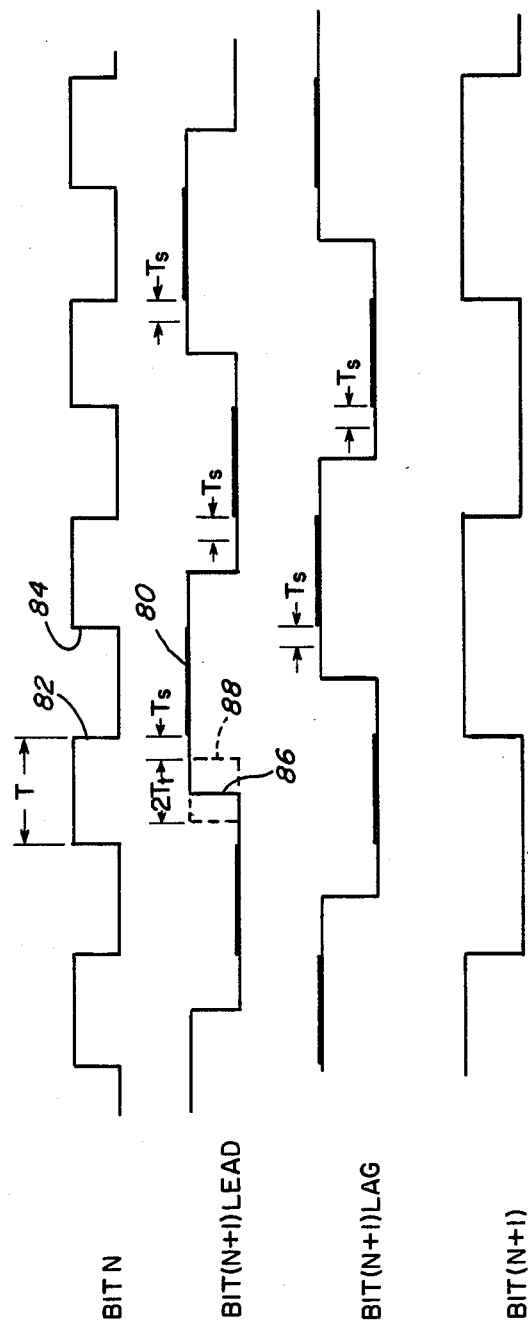

OPTICALLY MULTIPLEXED ENCODER SYSTEM

DESCRIPTION

1. Technical Field

This invention relates to a system for monitoring the angular position of a device by means of concentric code tracks which are electrooptically detected and electronically decoded and in particular to such a system in which code tracks are multiplexed.

2. Background

FIG. 1 illustrates a typical optical encoder system. A code disc 20 is mounted to an encoder shaft 22', the angular position of which is to be monitored. The disc is generally glass and has a series of concentric annular code tracks inscribed thereon. Each track comprises alternate transparent and opaque segments defining equal parts around the shaft 22'. The number of code cycles per track may vary from one cycle on the coarsest track 23 to several thousand cycles on the outer fine track 25. The actual angular position of the code disc can be determined from the instantaneous binary states of several code tracks.

In FIG. 1, the optical code reading system is shown for the fine track, it being understood that each track is similarly read. The track is illuminated by a light emitting diode (LED) 26'. The thus illuminated transparent and opaque segments of the track are viewed by photodetectors 28 through precision optical slits 30. The instantaneous photodetector output is dependent on whether transparent or opaque segments are aligned with the photodetectors and their associated slits. The detectors associated with other than the finest track provide square wave outputs as the disc rotates, and together the outputs from several tracks represent a binary code.

The segments on the fine track are so closely spaced that they form a diffraction grating which provides for high fidelity sinusoidal photodetector outputs as the code disc rotates. The sinusoidal outputs from the fine track are processed in code multiplier circuit to provide a position indication of a high resolution. That resolution would not be possible with a simple binary readout of the fine track 25. To that end, Sidney Wingate has shown that two square waves of the same spatial frequency but out of phase can be logically combined, as in an exclusive-OR gate, to provide a new square wave of twice the input frequency. If that signal having twice the frequency is then logically combined with a similar but out of phase signal, a signal having four times the spatial frequency of the original signals can be provided. The multiple phase shifting necessary in such a method is provided by summing and weighting sine and cosine signals. The resultant phase shifted sinusoids are then converted to square waves for the logical combination noted above. See U.S. Pat. Nos. 3,310,798 and 3,312,828 to Wingate.

The code tracks other than the fine track are termed cycle counting bits. Together these bits determine the absolute address of the fine track cycle at which the disc is positioned. In one type of system each of these tracks provides a direct natural binary output. The spatial frequency of the tracks decreases toward the center of the code disc to a one cycle per revolution code at the innermost track. Each signal from a natural binary track must be synchronized with the preceding track. To that end, conventional systems utilize two detectors for each natural binary track, a lead detector and a lag detector. The transitions of the signals from these detectors are guaranteed to lead or lag transitions in the next less significant bit as shown in FIG. 2. Depending on the value of the preceding bit, either the lead or the lag detector signal is used to form the next significant bit. Specifically, if the lower order bit, Bit N, is a logic zero the system selects the lead signal, and if the lower order bit is a logic one the system selects the lag signal. The result is the synchronized natural binary bit shown at the bottom of FIG. 2.

A variation of the above-described V-scan system is the U-scan system. In this system a track can be eliminated and the corresponding bit can be derived from the preceding and succeeding tracks. In that case four detectors, two leads and two lags, each of quadrature relationship, are required on the succeeding track.

An alternate code which does not require lead/lag detectors is the Gray code. With the Gray code only one bit is in transition at any given time. Thus, synchronization between tracks by means of lead and lag detectors is not required.

In my copending patent application, Ser. No. 197,646, now U.S. Pat. No. 4,360,730, filed Oct. 16, 1980, for An Optical Encoder System and assigned to the assignee of this application, I have disclosed an optical encoder system in which the higher resolution code tracks are encoded in a V-scan natural binary code and the coarser code tracks are encoded in Gray code. The V-scan and Gray code signals are optically multiplexed. When the encoder system is interrogated, a timer sequentially energizes each of a number of light emitting diodes. Each diode illuminates several code tracks and the associated photodetectors. Photodetectors corresponding to the several LEDs are connected in common to provide code track signals multiplexed in accordance with the LED sequence.

The optically multiplexed system disclosed in my above-mentioned patent application is limited in its time of response to an interrogate signal by the time required to sequentially enable the LEDs and to demultiplex and decode the signals received from the code tracks. Although a final natural binary output can be provided within about 100 microseconds, even that delay is not tolerable in certain applications.

An object of this invention is to provide an optical encoder system which allows for the savings in circuitry made possible by optical multiplexing yet which retains the high data rate and minimum velocity lag of conventional absolute encoder systems. A feature of this invention is that, when the system is interrogated, a near instantaneous angular output is provided.

SUMMARY OF THE INVENTION

In an optical angular encoder system, the code track signals are optically multiplexed by selectively enabling illuminators, each of which is associated with a plurality of code tracks. Each such optically multiplexed code track signal is sampled and stored during an angular sampling window which precedes each transition of the lowest resolution signal to which the stored signal is to be synchronized. Each sampling window is sufficiently small relative to the angular tolerance of the code track signal that that signal and the signal to which it is synchronized do not change states during the same sampling window.

In the preferred form of the invention, at least one code track is illuminated continuously to provide a continuous, absolute output from an associated code track. Lower resolution code tracks are optically multiplexed by a free running sequencer which sequentially and repeatedly samples all code tracks. All sampled information is stored such that it is available for an immediate angular output when the system is interrogated. That previously sampled information is valid when the system is interrogated and is immediately synchronized to the at least one continuous output. In the case of V-scan or U-scan logic, both the lead and the lag signals are sampled and held prior to the interrogation.

BRIEF DESCRIPTION OF THE DRAWINGS

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

FIG. 5 is a timing chart of the four timing signals for multiplexing and demultiplexing the code track signals; and FIG. 6 is a timing chart illustrating sampling windows utilized in a V-scan logic system.

PREFERRED MODE OF CARRYING OUT THE INVENTION

Figure 3:
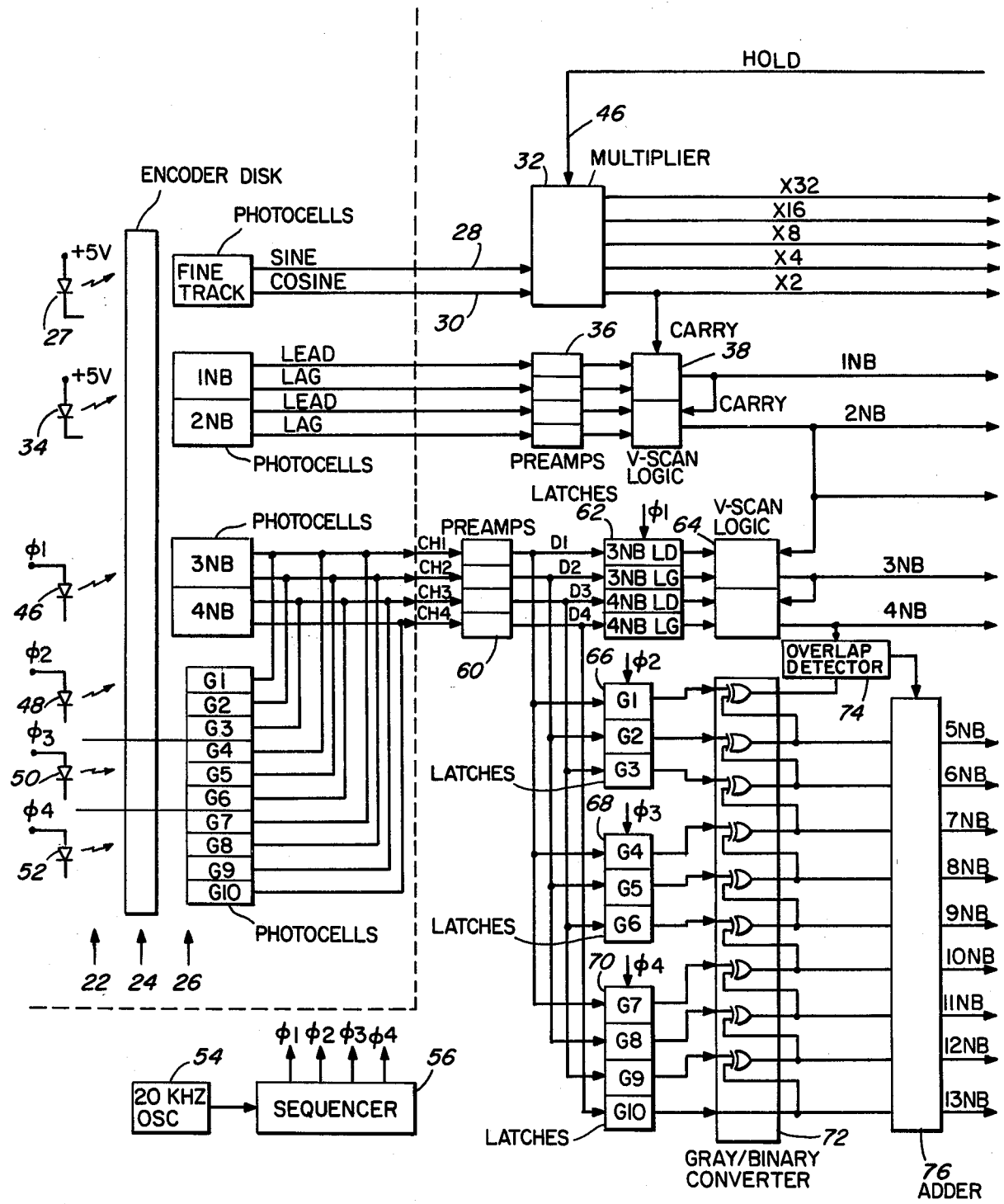
FIG. 3 is an electrical block diagram of an encoder system embodying this invention.

A block diagram of the code detecting and decoding circuit of the preferred system embodying this invention is shown in FIG. 3. As will be discussed below, the code detecting optics includes a number of light emitting diodes 22 which illuminate the code tracks on an encoder disc 24 and a number of photodetectors 26 which are illuminated in accordance with the angular position of the code disc.

The fine track, that is the track of highest resolution, is continuously illuminated by an LED 27. Conventional sinusoidal outputs are taken from the fine track on lines 28 and 30. These signals are phase separated by 90 degrees of the fine track cycle and are termed the sine and cosine signals. The sine and cosine signals are applied to a multiplier circuit 32. This multiplier circuit derives several bits of information from the sine and cosine signals to provide for a high resolution output. The multiplier may be conventional but is preferably of the quadrant switched type disclosed in my above-mentioned patent application. A X32 multiplier is shown but other configurations are also feasible.

Figure 1:
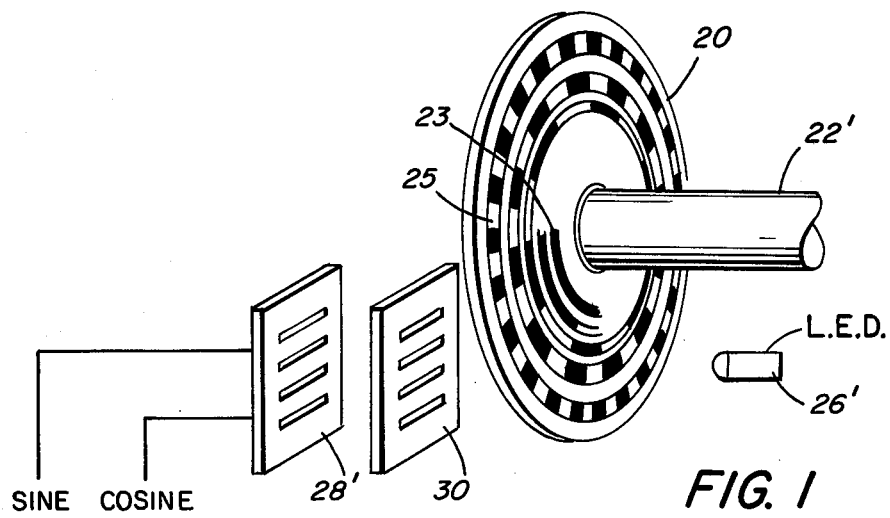
FIG. 1 is a perspective view illustrating a typical encoder disc and the code detecting optics for the fine track of that disc.
Figure 2:
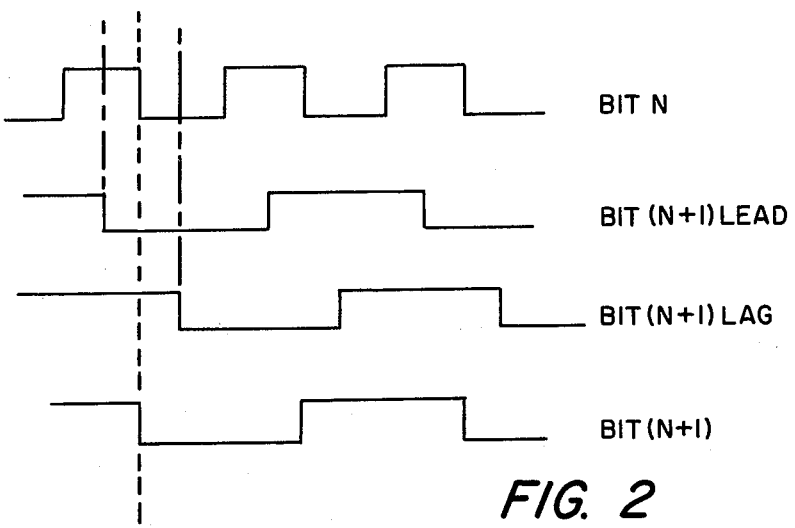
FIG. 2 shows typical wave forms illustrating conventional lead/lag detection of a code track to synchronize the output signal with a preceding code track.

Two natural binary code tracks are continuously illuminated by an LED 34. The natural binary code is characterized by multiple bit transitions at code changes; and changing to all zeros from all ones or vice versa is the most extreme example. If a single detector were used for each track, and the code disc and slits were not perfectly aligned, some bits could come on or off slightly early or late, thus rendering the output word grossly inaccurate. A V-scan system is used in conventional natural binary systems to avoid ambiguity in the readout signals, and such a system is used here to read the natural binary bits. The V-scan is characterized by the fact that all cycle counting bits are derived from two locations. Those locations are phased with respect to the sine signal from the fine track in such a manner that no detected V-scan signal is ever in transition when the fine track is changing. As was shown in FIG. 2, one detected signal leads the signal of the preceding bit and another signal lags the preceeding bit signal. If the lower order bit is a logic zero, the lead photodetector signal is selected, and if the lower order bit is a one, the lag detector signal is selected. This provides the bit shown at the bottom of FIG. 2, that bit being synchronized to the preceding natural binary bit. By thus synchronizing each natural binary bit with the preceding natural binary bit all such bits are synchronized to the fine track.

The detector circuitry associated with the 1NB and 2NB code tracks provides a lead signal and a lag signal from each code track. Those lead and lag signals are preamplified and digitized to clean square waves by a bank of preamplifiers 36. To synchronize the 1NB and 2NB outputs with the X2 multiplier output a lead or lag signal from each of the first two natural binary tracks is selected by one of a pair of V-scan logic circuits 38.

Figure 4:
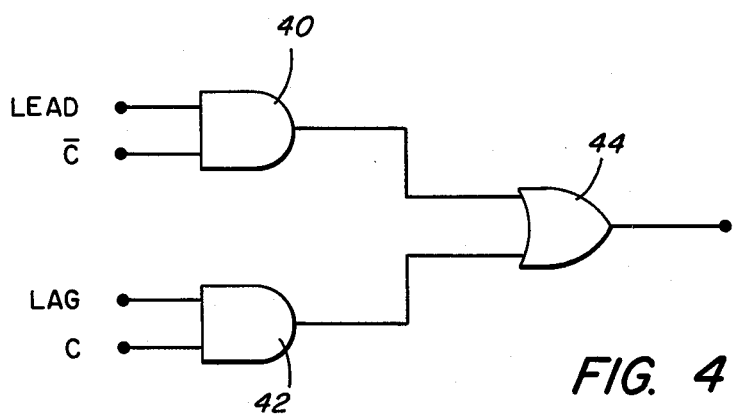
FIG. 4 is an electrical logic diagram illustrating a V-scan logic utilized in the circuit of FIG. 3.

Each V-scan logic circuit is as shown in FIG. 4. In the case of the 1NB signal, the carry signal is the squared sine wave taken from the fine track, the X2 signal. In the case of the 2NB signal the carry is the 1NB signal. Carry and inverted carry signals are applied to respective AND-gates 40 and 42 along with the lead and lag signals, and the outputs of those gates are applied to an OR-gate 44. This provides the logic discussed above with respect to FIG. 2.

Because the fine track and first two natural binary code tracks are illuminated continuously, an output can be provided almost instantaneously when an interrogated Hold signal is applied to the multiplier 32 from a line 46. With the Hold signal applied, the X2 through X32 outputs are held at their states at that instant. Also, the carry signal held on the X2 line passes through the V-scan logic to provide proper outputs on lines 1NB and 2NB almost instantaneously.

In accordance with the principles set forth in my above-mentioned prior patent application, additional natural binary code tracks and Gray code tracks are optically multiplexed. In the optically multiplexed system disclosed in that patent application, four LEDs sequentially illuminate a greater number of code tracks after an interrogate signal is applied to the system. Alternatively, additional LEDs might be provided but enabled together as sets of illuminators. In accordance with the principles of this invention four LEDs 46, 48, 50 and 52 are sequentially enabled repeatedly even before the system is interrogated. To that end, a 20 kilohertz oscillator 54 serves as a free-running clock and drives a sequencer/controller 56 which generates the four timing signals $\phi 1-\phi 4$ of FIG. 5. After sequencing from $\phi 1$ through $\phi 4$, the sequencer/controller immediately generates $\phi 1$ again for another sequence.

With the $\phi 1$ signal high, LED 46 illuminates the 3NB and 4 NB code tracks. The lead and lag signals detected from those code tracks are carried through to a bank of four preamplifiers/digitizers 60 on lines CH1-CH4.

Those preamplifiers provide clean digital signals on lines D1–D4 which, during the $\phi1$ time interval, are stored in a bank of four latches 62. Both lead and lag signals must be stored because the one which is to be passed through to the output cannot be selected until the interrogate signal is applied on line 46. The signals stored in the latches 62 are applied to a pair of V-scan logic circuits 64 similar to the logic circuits 38 of FIG. 4. After a signal from line 45, the carry signal held on line 2NB passes through the V-scan logic 64, and proper natural binary signals are selected and held on lines 3NB and 4NB.

Although additional natural binary code tracks might be utilized in the system, this particular system makes use of Gray code tracks to provide the next nine natural binary output bits. As taught in my above-mentioned patent application, such mixing of natural binary and Gray code tracks provides for the high accuracy of V-scan logic while minimizing the complexity of the V-scan system.

In this case, the LED 48 is enabled during the $\phi2$ time interval. That LED illuminates the G1–G3 Gray code track. The signals from those code tracks are passed through lines CH1–CH3 and the bank of preamplifiers 60 to lines D1–D3. The signals on those lines are stored in latches 66 during this $\phi2$ interval.

Similarly, the LEDs 50 and 52 are enabled during the $\phi3$ and $\phi4$ time intervals. The G4–G6 signals are first passed by way of lines CH1–CH3 through the preamplifiers 60 to latches 68, and then Gray code signals G7–G10 are passed through lines CH1–CH4 and preamplifiers 60 to latches 70.

The Gray code bits held in latches 66, 68 and 70 are decoded to a natural binary code by a decoder 72. That decoder is a bank of exclusive-OR gates. Each bit other than the most significant bit is formed by exclusive-OR gating the Gray code bit with the next more significant natural binary bit. The most significant natural binary bit is the same as the most significant Gray code bit.

Although the natural binary bits decoded from the Gray code are inherently synchronized with each other, these bits must still be synchronized to the fourth natural binary bit derived from the lead/lag logic. To that end, the code tracks are designed such that the natural binary bits derived from the Gray code include one bit which overlaps the fourth natural binary bit but which lags the latter bit by 90 cycle degrees.

The least significant natural binary bit derived from the Gray code is compared with the most significant natural binary bit already linked to the fine track. The comparison is made by an overlap detector 74. The detector 74 is an AND gate which has the 4NB bit inverted as one input and the overlapping natural binary bit from the Gray code as another input. If the last natural binary bit is a zero and the natural binary overlap bit derived from the Gray code is a one, it is assumed that the former has undergone a transition while the Gray code sequence still lags. In that case a one is added to the entire decoded Gray code bit sequence in adder 76 to make the overlapping bit equal to the synchronized bit. This places the entire sequence of bits derived from the Gray code in synchronization with the fine track. The redundant overlapping bit is dropped from the output.

It can be seen from FIG. 3 and the above description, that so long as the proper signals are held in latches 62, 66, 68 and 70 when a Hold signal is applied on line 45, the carry signals pass through the system to provide a 13 bit cycle counting output. The carry signal passes through this system in about two microseconds. If the user applies a three microsecond Hold signal he can be assured that the carry signal has rippled through the logic to provide an accurate output. This three microsecond hold can be compared to the 100 microseconds required after an interrogate signal to sequence through the optical multiplexing and demultiplexing as in my prior patent application. This near instantaneous readout is made possible by storing all lead and lag signals detected in the optically multiplexed portion of the system and by providing an individual V-scan logic circuit for each natural binary code track in that portion of the system. Further, the optical multiplexing and demultiplexing takes place continuously and repeatedly in response to a free running oscillator 54. Thus, at any instant when a Hold signal is applied on line 45, the circuitry relies on the data sampled in the preceding 200 microseconds to provide an accurate output.

As will now be discussed, the length of the sampling window, which in this case is 200 microseconds, and the optically multiplexed portion of the system must be selected, with respect to the resolution of the code tracks and the maximum velocity of the encoder, so that the signals stored in the optically multiplexed portion of the system during the preceding sampling window provide an accurate output at any instant during rotation of the encoder.

FIG. 6 again illustrates the relationship of lead and lag signals taken from a natural binary code track, the natural binary signal generated from those lead and lag signals, and the preceding natural binary signal, bit N, to which the generated signal is synchronized. FIG. 6 can be considered to be a time chart where the encoder disc is rotating at a constant speed. In this diagram, those portions of the lead and lag signals which are selected by the V-scan logic circuitry to make up the bit (N+1) signal are indicated by bold lines. It can be seen that where a signal indicated by a bold line is high the (N+1) signal is high, and where the signal indicated by a bold line is low the (N+1) signal is low.

As an example, consider the bold portion 80 of the lead signal which is selected to generate the natural binary output during a half cycle of the N signal. That portion 80 is selected from the instant that the bit N signal changes states at 82. To avoid an error in the output, the portion 80 must be high during the entire half cycle of the bit N signal from the change in state 82 to a subsequent change in state 84. From the latter change in state the lag signal is selected. Because the lead signal is not selected during the half cycle T preceding the change in state 82 or during the half cycle after the change in state 84, it does not matter, as far as the V-scan logic is concerned, what the state of the lead signal is during those periods.

The optical system for detecting the (N+1) code track is designed to provide a nominal change in state of the lead signal at 86, a time T/2 preceding the change in state 82 when the lead signal is selected. Due to angular tolerances in the system, the lead signal may change state anywhere between the extreme cases indicated in broken lines about the nominal change in state 86. In time, then, this transition 86 can occur anywhere within the range $2T_t$.

In the present system, the state of the lead signal is sampled and held once during each sequence of the sequencer/controller from $\phi1$ through $\phi4$; it is sampled during $\phi1$. By selecting a sufficiently short sequence cycle time, or sampling window $T_s$, one can be assured that the $\phi 1$ portion of the sequence occurs some time between the change in state 88 of the lead signal and the change in state 82 of the bit N signal. As a result, one can be certain that the lead signal is in its proper state at the instant that the bit N signal changes state at 82. To that end, the sample and hold sequence must make a complete cycle after the latest possible change in state 88 of the lead signal and prior to the change in state 82 of the bit N signal. Thus, the sequence cycle time, or sampling window time $T_s$, must be less than or equal to $(T/2 - T_t)$.

In the present system, the signals from the code tracks are sampled repeatedly in successive sampling windows under the control of a free-running oscillator 54. But the significant sequences for the lead and lag signals are the sequences which immediately precede the selection of each of those signals as indicated in FIG. 6. The remaining sample and hold sequences occur as a matter of convenience in establishing the significant sequences, but the information sampled in those remaining sequences does not carry through to the output.

In the most demanding case, the time periods T and $T_t$ are determined by the resolution of the bit N code track and the maximum speed at which the encoder disc rotates. The time period $T_t$ is also dependent on the precision with which the encoder disc is mounted with respect to the optical code detecting system. That precision determines the angular tolerance of the code track signals. In the present system two continuous natural binary tracks are followed by two additional optically multiplexed natural binary tracks and ten Gray code tracks; but depending upon the maximum encoder shaft speed and the resolution of the code tracks, the partition between continuous bits and sampled bits may be moved closer to the fine track or closer to the coarse track. A lower resolution encoder or slower shaft speed would make a larger sampling window $T_s$ available for a given bit, and one or both of the first two natural binary bits might then be included in the optically multiplexed portion of the system. Similarly, a higher resolution encoder or a higher shaft speed would make a smaller sampling window $T_s$ available for a given bit, and it might then be necessary to include more natural binary bits in the continuous portion of the system.

While the invention has been particularly shown and described with reference to a preferred embodiment thereof, it will be understood by those skilled in the art that various changes in form and details may be made therein without departing from the spirit and scope of the invention as defined by the appended claims. For example, although it is preferred that both V-scan natural binary and Gray code logic be used in the system, such a mixing of codes is not necessary. Also, the specific number of bits in the final output may be varied, and the signals processed in the continuous portion and optically multiplexed portion of the system may be varied.

I claim:

1. In a digital encoder having an encoding member bearing a first group of tracks, at least one track having light transmissive coded segments therein of relatively high spacial frequency and a second group of coarser binary code tracks relative to the tracks in said first group having segments therein of relatively low spatial frequency, the improvement comprising:
   first track illumination means for continuously directing light at said first group of tracks;
   first light detector means for detecting light modulated by said first group of tracks and for continuously producing an output signal for each track within said first group of tracks;
   second track illumination means for sequentially directing light at each track within said second group of tracks in sequence;
   coarse track data storage latching means having an input circuit;
   coarse track second light detector means coupled to said input circuit of said coarse track data storage latching for sequentially transmitting coded data associated with said second group of tracks to said data storage latching means; and
   means for reading said coded data stored within said data storage latching means along with said output signals produced by said first light detector means to establish the position of said encoding member relative to said first and second light detector means.

2. The combination as set forth in claim 1 including means for repeatedly operating said second track illumination means for causing groups of bursts of light, each burst sequentially directed at each track within said second group of tracks, to be directed over and over at said encoding member.

* * * * *